United States Patent
Cho et al.

(10) Patent No.: US 12,266,659 B2
(45) Date of Patent: Apr. 1, 2025

(54) SEMICONDUCTOR DEVICE

(71) Applicant: SAMSUNG ELECTRONICS CO., LTD., Suwon-si (KR)

(72) Inventors: Keunhwi Cho, Seoul (KR); Jinkyu Kim, Boryeong-si (KR); Myunggil Kang, Suwon-si (KR); Dongwon Kim, Seongnam-si (KR); Jaechul Kim, Hwaseong-si (KR); Sanghoon Lee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 475 days.

(21) Appl. No.: 17/843,263

(22) Filed: Jun. 17, 2022

(65) Prior Publication Data
US 2023/0109148 A1    Apr. 6, 2023

(30) Foreign Application Priority Data
Sep. 27, 2021 (KR) .......... 10-2021-0127090

(51) Int. Cl.
*H01L 27/118* (2006.01)
*H03K 19/20* (2006.01)

(52) U.S. Cl.
CPC .......... *H01L 27/11807* (2013.01); *H01L 2027/11824* (2013.01); *H03K 19/20* (2013.01)

(58) Field of Classification Search
CPC ................................ H01L 27/118
See application file for complete search history.

(56) References Cited

U.S. PATENT DOCUMENTS

| | | | |
|---|---|---|---|
| 8,921,920 B2* | 12/2014 | Kawanaka | G11C 14/0081 257/324 |
| 10,892,331 B2 | 1/2021 | Yamashita et al. | |
| 10,971,630 B2 | 4/2021 | Liaw | |
| 10,985,069 B2 | 4/2021 | Zhang et al. | |
| 11,069,818 B2* | 7/2021 | Kang | H01L 29/66772 |
| 2009/0027131 A1 | 1/2009 | Suzuki | |
| 2016/0172360 A1* | 6/2016 | Shimbo | H01L 21/845 257/401 |
| 2020/0043926 A1 | 2/2020 | Ohtou et al. | |
| 2020/0381432 A1 | 12/2020 | Lee et al. | |
| 2021/0066291 A1 | 3/2021 | Lin et al. | |
| 2022/0384415 A1* | 12/2022 | Park | H01L 27/11807 |

* cited by examiner

*Primary Examiner* — Mounir S Amer
(74) *Attorney, Agent, or Firm* — Sughrue Mion, PLLC

(57) ABSTRACT

A semiconductor device includes a substrate including a first device region and a second device region, active regions spaced apart from each other on the substrate, having a constant width, extending in a first direction parallel to an upper surface of the substrate and including a first active region and a second active region provided on the first device region and a third active region and a fourth active region provided on the second device region, a plurality of channel layers provided on the active regions and configured to be spaced apart from each other in a direction perpendicular to the upper surface of the substrate, gate structures provided on the substrate and extending to cross the active regions and the plurality of channel layers, and source/drain regions provided on the active regions on at least one side of the gate structures.

20 Claims, 10 Drawing Sheets

DV1

DV1

SEMICONDUCTOR DEVICE

CROSS-REFERENCE TO RELATED APPLICATION(S)

This application is based on and claims priority to Korean Patent Application No. 10-2021-0127090 filed on Sep. 27, 2021 in the Korean Intellectual Property Office, the disclosure of which is incorporated herein by reference in its entirety.

BACKGROUND

1. Field

The disclosure relates to a semiconductor device.

2. Description of Related Art

While demands for high performance, high speed, and/or multifunctionality of a semiconductor device increase, demand for a degree of integration of the semiconductor device is also increasing. In manufacturing a semiconductor device having a fine pattern corresponding to the trend for high integration of a semiconductor device, it is necessary to implement patterns having a fine width or a fine separation distance therebetween. In addition, in order to overcome the limitation of operating characteristics due to a decrease in the size of planar metal oxide semiconductor field effect transistors (FETs), efforts are being made to develop a semiconductor device including a FinFET having a channel having a three-dimensional structure.

SUMMARY

Provided is a semiconductor device having improved electrical characteristics.

Additional aspects will be set forth in part in the description which follows and, in part, will be apparent from the description, or may be learned by practice of the presented embodiments.

In accordance with an aspect of the disclosure, a semiconductor device may include a first device including a first active region on a substrate and extending in a first direction parallel to an upper surface of the substrate, a plurality of first channel layers provided on the first active region and configured to be spaced apart from each other in a direction perpendicular to the upper surface of the substrate, a second active region spaced apart from and extending in parallel with the first active region, a plurality of second channel layers provided on the second active region and configured to be spaced apart from each other in the direction perpendicular to the upper surface of the substrate, a first source/drain region provided on the first active region on at least one side of the at least one first gate structure, and a second source/drain region provided on the second active region on at least one side of the at least one first gate structure, a second device including a third active region on the substrate and extending in the first direction, a plurality of third channel layers provided on the third active region and configured to be spaced apart from each other in the direction perpendicular to the upper surface of the substrate, a fourth active region spaced apart from and extending in parallel with the third active region, a plurality of fourth channel layers provided on the fourth active region and configured to be spaced apart from each other in the direction perpendicular to the upper surface of the substrate, second gate structures crossing the third active region and the fourth active region and extending in parallel with each other in the second direction, a third source/drain region provided on the third active region on at least one side of the second gate structures, and a fourth source/drain region provided on the fourth active region on at least one side of the second gate structures, and a third device including a fifth active region on the substrate and extending in the first direction, a plurality of fifth channel layers provided on the fifth active region and configured to be spaced apart from each other in the direction perpendicular to the upper surface of the substrate, a sixth active region spaced apart from and extending in parallel with the fifth active region, a plurality of sixth channel layers provided on the sixth active region configured to be spaced apart from each other in the direction perpendicular to the upper surface of the substrate, third gate structures crossing the fifth active region and the sixth active region and extending in parallel with each other in the second direction, a fifth source/drain region provided on the fifth active region on at least one side of the third gate structures, and a sixth source/drain region provided on the sixth active region on at least one side of the third gate structures. A first width of the first active region may be wider than a second width of the second active region, a third width of the third active region may be wider than a fourth width of the fourth active region, and a fifth width of the fifth active region may be substantially equal to a sixth width of the sixth active region.

In accordance with an aspect of the disclosure, a semiconductor device may include a substrate including a first device region and a second device region, active regions spaced apart from each other on the substrate, having a constant width, extending in a first direction parallel to an upper surface of the substrate and including a first active region and a second active region provided on the first device region and a third active region and a fourth active region provided on the second device region, a plurality of channel layers provided on the active regions and configured to be spaced apart from each other in a direction perpendicular to the upper surface of the substrate, gate structures provided on the substrate and extending to cross the active regions and the plurality of channel layers, and source/drain regions provided on the active regions on at least one side of the gate structures. The first active region and the third active region may have P-type conductivity, the second active region and the fourth active region may have N-type conductivity, a first width of the first active region may be wider than a second width of the second active region, a third width of the third active region may be wider than a fourth width of the fourth active region, and a difference between the first width and the second width may be less than a difference between the third width and the fourth width.

A semiconductor device may include a first device including a first active region on a substrate and extending in a first direction parallel to an upper surface of the substrate, a second active region spaced apart from and extending in parallel with the first active region, at least one first gate structure crossing the first active region and the second active region and extending in a second direction, a first source/drain region provided on the first active region on at least one side of the at least one first gate structure, and a second source/drain region provided on the second active region on at least one side of the at least one first gate structure, and a second device including a third active region on the substrate and extending in the first direction, a fourth active region spaced apart from and extending in parallel with the third active region, second gate structures crossing the third active region and the fourth active region and extending in parallel with each other in the second direction, a third source/drain region provided on the third active region on at least one side of the second gate structures, and a fourth source/drain region provided on the fourth active region on at least one side of the second gate structures. The first active region and the third active region may have P-type conductivity, the second active region and the fourth active region may have N-type conductivity, a first width of the first active region may be wider than a second width of the second active region, a third width of the third active region may be wider than a fourth width of the fourth active region, and a difference between the first width and the second width may be less than a difference between the third width and the fourth width.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Hereinafter, embodiments of the present disclosure will be described with reference to the accompanying drawings.

The embodiments described herein are example embodiments, and thus, the disclosure is not limited thereto and may be realized in various other forms. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. In the present specification, the pattern signal may refer to a signal having a waveform that is periodically repeated.

Figure 1:
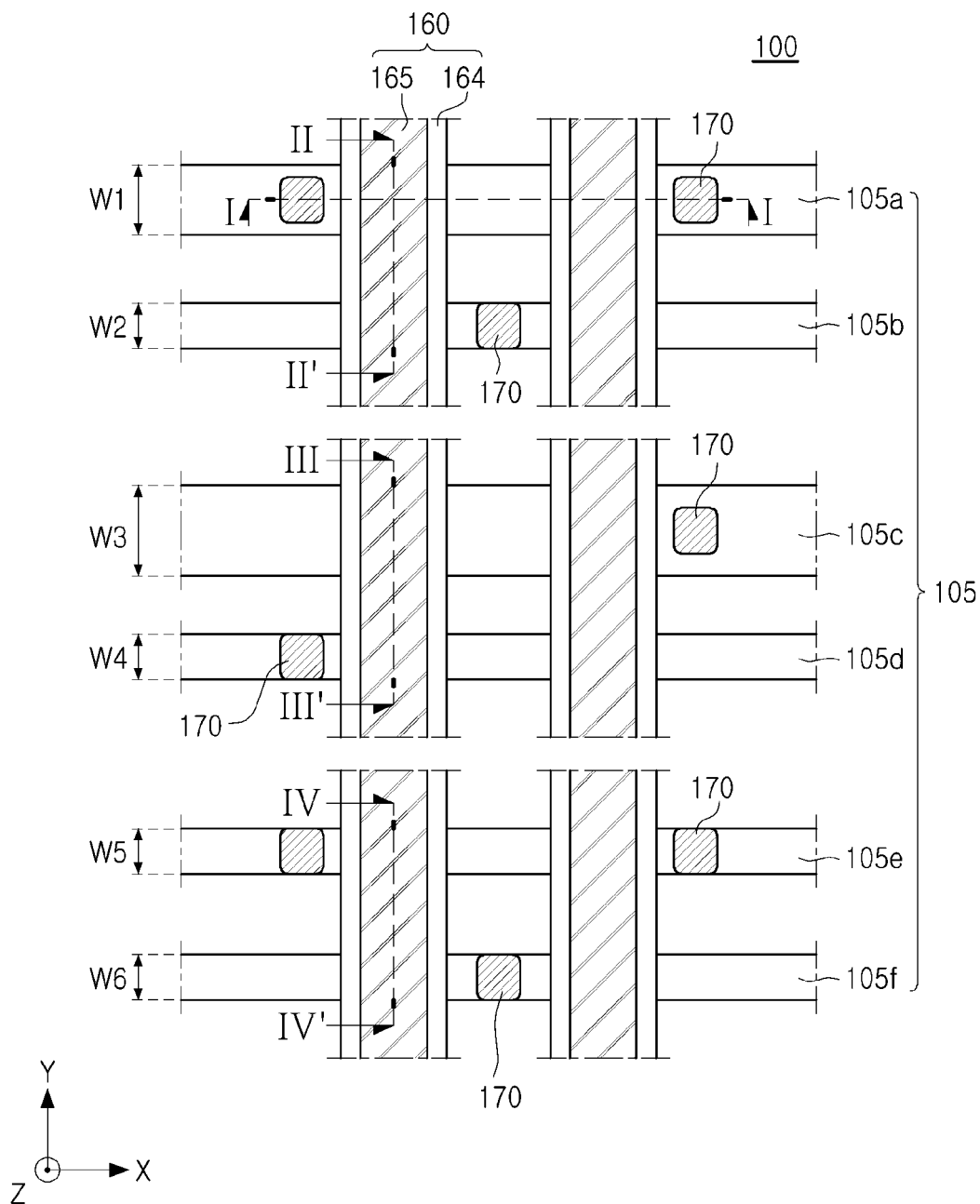
FIG. 1 is a plan view illustrating a semiconductor device according to an embodiment.

FIG. 1 is a plan view illustrating a semiconductor device 100 according to an embodiment.

Figure 2A:
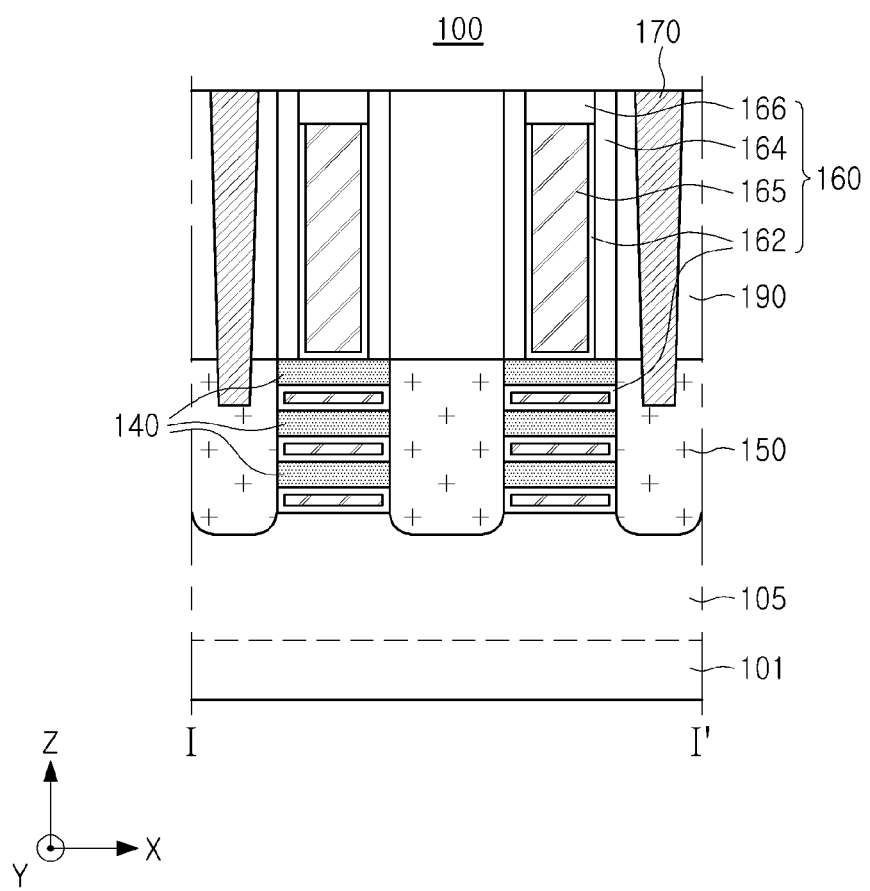
FIGS. 2A, 2B, 2C and 2D are cross-sectional views illustrating a semiconductor device according to an embodiment.
Figure 2B:
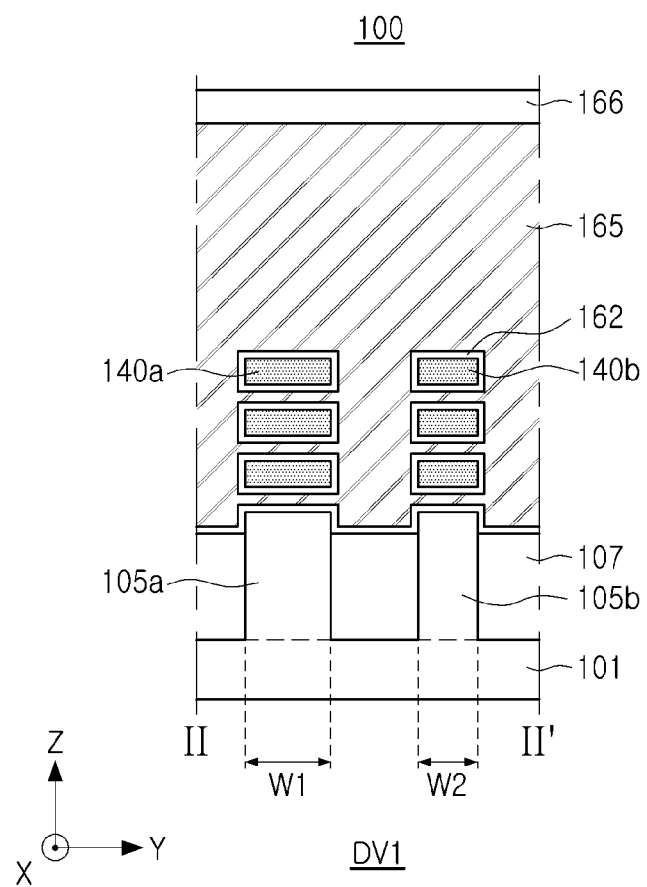
Figure 2C:
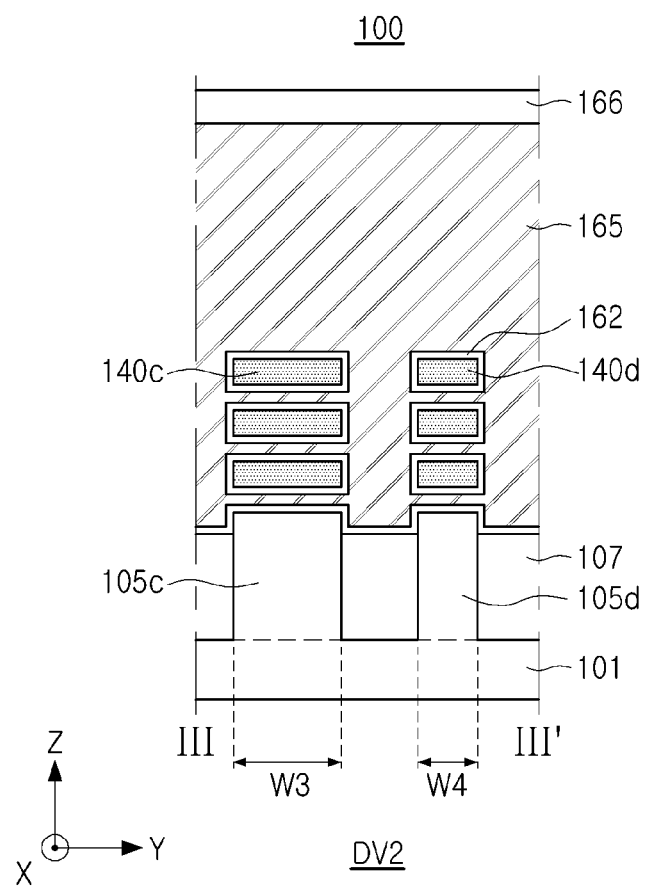
Figure 2D:
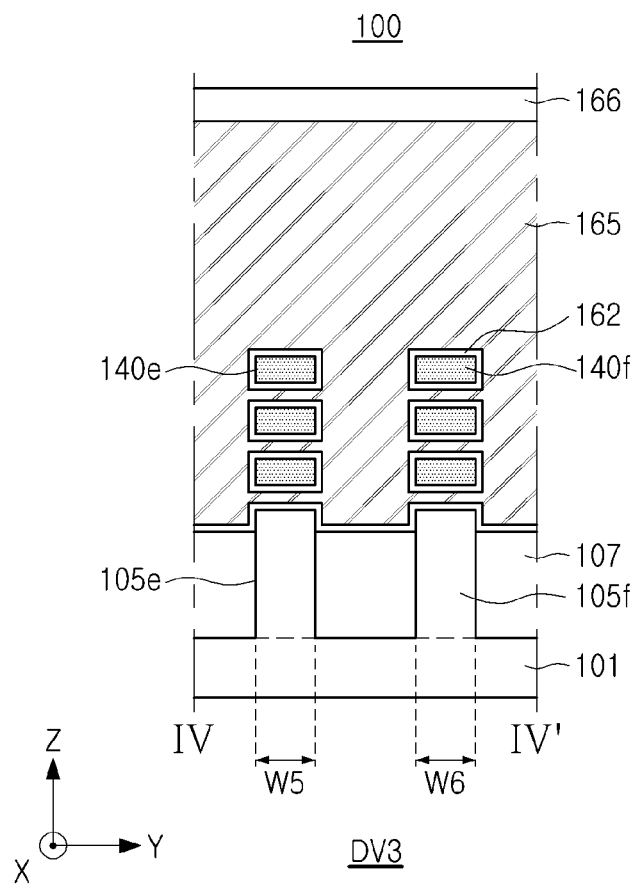

FIGS. 2A, 2B, 2C and 2D are cross-sectional views illustrating a semiconductor device 100 according to an embodiment. FIG. 2A is a cross-sectional view of the semiconductor device 100 of FIG. 1 taken along line I-I', FIG. 2B is a cross-sectional view of the semiconductor device 100 of FIG. 1 taken along line II-II', FIG. 2C is a cross-sectional view of the semiconductor device 100 of FIG. 1 taken along line III-III', while FIG. 2D is a cross-sectional view of the semiconductor device 100 of FIG. 1 taken along line IV-IV'. For convenience of description, only major components of the semiconductor device will be illustrated in FIGS. 1 to 2D.

Referring to FIGS. 1 to 2D, a semiconductor device 100 may include a substrate 101, active regions 105 on the substrate 101, device isolation layers 107 separating the active regions 105 from each other, a plurality of channel layers 140 disposed on the active regions 105, source/drain regions 150 connected to the plurality of channel layers 140, gate structures 160 extending to cross the active regions 105, contact plugs 170, and an interlayer insulating layer 190. Each of the gate structures 160 may include a gate dielectric layer 162, a gate electrode 165, a spacer structure 164, and a capping layer 166.

In the semiconductor device 100, the active regions 105 may have a fin structure, and the gate electrode 165 may be disposed between the active regions 105 and the plurality of channel layers 140, between the plurality of channel layers 140, and on the plurality of channel layers 140. Therefore, the semiconductor device 100 may include a transistor having a multi-bridge channel field effect transistor (FET) (multi-bridge channel FET (MBCFET™)) structure, in which may be a gate-all-around FET, by including the plurality of channel layers 140, the source/drain regions 150, and the gate structures 160. According to an embodiment, the semiconductor device may be a fin-type FET (FinFET) including channel layers having a fin structure, source/drain regions, and a gate structure crossing the channel layers and covering the channel layers.

The semiconductor device 100 may include first to third devices DV1, DV2, and DV3 having a complementary metal-oxide semiconductor (CMOS) structure including channel layers of different conductivity types. For example, each of the first to third devices DV1, DV2, and DV3 may include an N-type MOS (NMOS) transistor region and a P-type (PMOS) transistor region.

The substrate 101 may have an upper surface extending in an X-direction and a Y-direction. The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon-germanium (SiGe). The substrate 101 may be provided as a bulk wafer, an epitaxial layer, a silicon-on-insulator (SOI) layer, a semiconductor-on-insulator (SeOI) layer, or the like.

The active regions 105 may be disposed to extend in a direction, parallel to the upper surface of the substrate 101, for example, in the X-direction. The active regions 105 may be spaced apart from each other in the Y-direction, and may be disposed in parallel. The active regions 105 may protrude from the upper surface of the substrate 101 in a Z-direction, perpendicular thereto. Upper ends of the active regions 105 may be disposed to protrude from upper surfaces of the device isolation layers 107 by a predetermined height. The active regions 105 may be formed as a portion of the substrate 101, or may include an epitaxial layer grown from the substrate 101. The active regions 105 on the substrate 101 may be partially recessed on both sides of the gate structures 160, and the source/drain regions 150 may be disposed on the recessed active regions 105.

In an example embodiment, the active regions 105 may include a first active region 105a and a second active region 105b, adjacent to each other. The first active region 105a and the second active region 105b may have a linear shape or a bar shape extending in the X-direction, respectively. The first active region 105a and the second active region 105b may be spaced apart from each other, and may extend in parallel, but the present disclosure is not limited thereto. The first active region 105a and the second active region 105b may have different conductivity types. The first active region 105a may form an N-type transistor region, and the second active region 105b may form a P-type transistor region. Therefore, the first active region 105a may have P-type conductivity, and the second active region 105b may have N-type conductivity.

The first device DV1 may include a first active region 105a and a second active region 105b. The first device DV1 may be a CMOS structure including an N-type transistor including the first active region 105a and a P-type transistor including the second active region 105b. A first width W1 of the first active region 105a of the first device DV1 may be greater than a second width W2 of the second active region 105b of the first device DV1. A ratio of the first width W1 and the second width W2 may be, for example, about 1.05:1 to 1.15:1. In the first device DV1, the number of N-type transistors connected in series may be equal or similar to the number of P-type transistors connected in series. The first device DV1 may include, for example, an inverter circuit.

In an example embodiment, the active regions 105 may include a third active region 105c and a fourth active region 105d, adjacent to each other. The third active region 105c and the fourth active region 105d may have a linear shape or a bar shape extending in the X-direction, respectively. The third active region 105c and the fourth active region 105d may be spaced apart from each other, and may extend in parallel, but the present disclosure is not limited thereto. The third active region 105c and the fourth active region 105d may have different conductivity types. The third active region 105c may form an N-type transistor region, and the fourth active region 105d may form a P-type transistor region. Therefore, the third active region 105c may have P-type conductivity, and the fourth active region 105d may have N-type conductivity.

The second device DV2 may include a third active region 105c and a fourth active region 105d. The second device DV2 may be a CMOS structure including an N-type transistor including the third active region 105c and a P-type transistor including the fourth active region 105d. A third width W3 of the third active region 105c of the second device DV2 may be greater than a fourth width W4 of the fourth active region 105d of the second device DV2. A ratio of the third width W3 and the fourth width W4 may be, for example, about 1.1:1 to 1.2:1. The second device DV2 may include N-type transistors connected in series. In the second device DV2, the number of N-type transistors connected in series may be greater than the number of P-type transistors connected in series. The second device DV2 may be an N-type dominant device. As the number of transistors connected in series increases, resistance may increase. Therefore, controlling a width of an active region of a conductivity type having a large number of transistors connected in series may be to play an important role in semiconductor performance. Therefore, in this specification, the term 'dominant' may mean that the number of transistors connected in series in a device is provided as being more than the number of others. The second device DV2 may include, for example, a NAND circuit.

In an example embodiment, the active regions 105 may include a fifth active region 105e and a sixth active region 105f, adjacent to each other. Each of the fifth active region 105e and the sixth active region 105f may have a linear shape or a bar shape extending in the X-direction. The fifth active region 105e and the sixth active region 105f may be spaced apart from each other, and may extend in parallel, but the present disclosure is not limited thereto. The fifth active region 105e and the sixth active region 105f may have different conductivity types. The fifth active region 105e may form an N-type transistor region, and the sixth active region 105f may form a P-type transistor region. Therefore, the fifth active region 105e may have P-type conductivity, and the sixth active region 105f may have N-type conductivity.

The third device DV3 may include a fifth active region 105e and a sixth active region 105f. The third device DV3 may be a CMOS structure including an N-type transistor including the fifth active region 105e and a P-type transistor including the sixth active region 105f. A fifth width W5 of the fifth active region 105e of the third device DV3 may be substantially equal to a sixth width W6 of the sixth active region 105f of the third device DV3. According to an example embodiment, the fifth width W5 may be smaller than the sixth width W6. The third device DV3 may include P-type transistors connected in series. In the third device DV3, the number of N-type transistors connected in series may be less than the number of P-type transistors connected in series. Therefore, the third device DV3 may be a P-type dominant device. The third device DV3 may include, for example, a NOR circuit.

A difference between the first width W1 and the second width W2 of the first device DV1 may be smaller than a difference between the third width W3 and the fourth width W4 of the second device DV2. In an example embodiment, the number of N-type transistors connected in series in the first device DV1 may be less than the number of N-type transistors connected in series in the second device DV2. A difference in the first device DV1 between the number of N-type transistors connected in series and the number of P-type transistors connected in series may be less than a difference in the second device DV2 between the number of N-type transistors connected in series and the number of P-type transistors connected in series. For example, the number of N-type transistors connected in series in the first device DV1 minus the number of P-type transistors connected in series in the first device DV1 may be less than the number of N-type transistors connected in series in the second device DV2 minus the number of P-type transistors connected in series in the second device DV2. In an example embodiment, the second width W2 may be substantially equal to the fourth width W4, and the first width W1 may be narrower than the third width W3. The present disclosure is not limited thereto, and may be variously changed, depending on an embodiment thereof.

A difference between the first width W1 and the second width W2 of the first device DV1 may be greater than a difference between the fifth width W5 and the sixth width W6 of the third device DV3. In an example embodiment, the number of P-type transistors connected in series in the first device DV1 may be less than the number of P-type transistors connected in series in the third device DV3. A difference in the first device between the number of P-type transistors connected in series and the number of N-type transistors connected in series may be less than a difference in the third device between the number of P-type transistors connected in series and the number of N-type transistors connected in series. For example, the number of P-type transistors connected in series in the first device DV1 minus the number of N-type transistors connected in series in the first device DV1 may be less than the number of P-type transistors connected in series in the third device DV3 minus the number of N-type transistors connected in series in the third device DV3.

The first to sixth active regions 105a, 105b, 105c, 105d, 105e, and 105f may be spaced apart from each other, and may extend in parallel in the X-direction. Each of the first to sixth active regions 105a, 105b, 105c, 105d, 105e, and 105f may extend to have a constant width.

According to an embodiment, when the present disclosure is a fin-type FET, a width of each of the first to sixth active regions may mean the number of fins constituting each of the first to sixth active regions.

The device isolation layers 107 may define the active regions 105 on the substrate 101. The device isolation layers 107 may be disposed between the active regions 105. Upper portions of the device isolation layers 107 may have levels, lower than levels of upper portions of the active regions 105. Therefore, the device isolation layers 107 may partially expose the upper portions of the active regions 105. In an example embodiment, the device isolation layers 107 may have a curved upper surface having a higher level as they are adjacent to the active regions 105, but the present disclosure is not limited thereto. The device isolation layers 107 may be formed by, for example, a shallow trench isolation (STI) process. The device isolation layers 107 may be formed of an insulating material. The device isolation layers 107 may be, for example, an oxide, a nitride, or a combination thereof.

The plurality of channel layers 140 may be stacked on the active regions 105 while being spaced apart from each other in the Z-direction, perpendicular to the substrate 101. The plurality of channel layers 140 may be spaced apart from upper surfaces of the active regions 105 while being connected to the source/drain regions 150. The plurality of channel layers 140 may have widths, equal or similar to widths of the active regions 105 in the Y-direction, and equal or similar to widths of the gate structures 160 in the X-direction. Although the plurality of channel layers 140 are illustrated as three, the number of the channel layers is not limited thereto, and may be variously changed. For example, in some embodiments, the plurality of channel layers 140 may further include a channel layer disposed on the upper surfaces of the active regions 105. The plurality of channel layers 140 may be formed of a semiconductor material, and may include, for example, at least one of Si, SiGe, or Ge. Each of the plurality of channel layers 140 may include the same material, but may include different materials according to embodiments.

In an example embodiment, the plurality of channel layers 140 may include a plurality of first channel layers 140a disposed on the first active region 105a to be spaced apart from each other in the Z-direction, a plurality of second channel layers 140b disposed on the second active region 105b to be spaced apart from each other in the Z-direction, a plurality of third channel layers 140c disposed on the third active region 105c to be spaced apart from each other in the Z-direction, a plurality of fourth channel layers 140d disposed on the fourth active region 105d to be spaced apart from each other in the Z-direction, a plurality of fifth channel layers 140e disposed on the fifth active region 105e to be spaced apart from each other in the Z-direction, and a plurality of sixth channel layers 140f disposed on the sixth active region 105f to be spaced apart from each other in the Z-direction. The plurality of first to sixth channel layers 140a, 140b, 140c, 140d, 140e, and 140f may be spaced apart from each other, respectively.

The plurality of first channel layers 140a may have a width, substantially equal to the first width W1 of the first active region 105a in the Y-direction, and may have a conductivity type, equal to a conductivity type of the first active region 105a. The plurality of second channel layers 140b may have a width, substantially equal to the second width W2 of the second active region 105b in the Y-direction, and may have a conductivity type, equal to a conductivity type of the second active region 105b. The plurality of third channel layers 140c may have a width, substantially equal to the third width W3 of the third active region 105c in the Y-direction, and may have a conductivity type, equal to a conductivity type of the third active region 105c. In an example embodiment, the plurality of fourth channel layers 140d may have a width, substantially equal to the fourth width W4 of the fourth active region 105d in the Y-direction, and may have a conductivity type, equal to a conductivity type of the fourth active region 105d. The plurality of fifth channel layers 140e may have a width, substantially equal to the fifth width W5 of the fifth active region 105e in the Y-direction, and may have a conductivity type, equal to a conductivity type of the fifth active region 105e. The plurality of sixth channel layers 140f may have a width, substantially equal to the sixth width W6 of the sixth active region 105f in the Y-direction, and may have a conductivity type, equal to a conductivity type of the sixth active region 105f.

The source/drain regions 150 may be disposed on the active regions 105 on at least one side of the plurality of channel layers 140. The source/drain regions 150 may be disposed to cover upper surfaces of the active regions 105 on side surfaces of each of the plurality of channel layers 140 and on lower ends of the source/drain regions 150. The source/drain regions 150 may be in contact with the plurality of channel layers 140. The source/drain regions 150 may be disposed by partially forming a recess in the upper portions of the active regions 105, but in embodiments, presence or absence of the recess and a depth of the recess may be variously changed. The source/drain regions 150 may be a semiconductor layer including Si, and may be formed of an epitaxial layer.

In some embodiments, the source/drain regions 150 may have a merged shape connected to each other between active regions 105 adjacent in the Y-direction, but the present disclosure is not limited thereto.

In an example embodiment, the source/drain regions 150 may include a first source/drain region disposed on the first active region 105a, a second source/drain region disposed on the second active region 105b, a third source/drain region disposed on the third active region 105c, a fourth source/drain region disposed on the fourth active region 105d, a fifth source/drain region disposed on the fifth active region 105e, and a sixth source/drain region disposed on the sixth active region 105f. The first source/drain region, the third source/drain region, and the fifth source/drain region may include different types and/or concentrations of impurities from those of the second source/drain region, the fourth source/drain region, and the sixth source/drain region. The first source/drain region, the third source/drain region, and the fifth source/drain region may include the same type of impurities. The second source/drain region, the fourth source/drain region, and the sixth source/drain region may include the same type of impurities. The first source/drain region may include an N-type conductivity, unlike the first active region 105a, and the second source/drain region may include a P-type conductivity unlike the second active region 105b.

The gate structures 160 may be arranged on the active regions 105 and the plurality of channel layers 140 to cross the active regions 105 and the plurality of channel layers 140 and extend in one direction, for example, the Y-direction. Channel regions of transistors may be formed in the active regions 105 and/or the plurality of channel layers 140, crossing the gate structures 160.

Each of the gate structures 160 may include a gate dielectric layer 162, a gate electrode 165, a spacer structure 164, and a capping layer 166. Upper and lower surfaces of each of the gate structures 160 between the plurality of channel layers 140 may be in contact with the plurality of channel layers 140.

The gate dielectric layer 162 may be disposed between each of the active regions 105 and the gate electrode 165 and between the plurality of channel layers 140 and the gate electrode 165, and may be disposed to cover at least a portion of surfaces of the gate electrode 165. For example, the gate dielectric layer 162 may be disposed to surround all surfaces of the gate electrode 165 except an uppermost surface of the gate electrode 165. The gate dielectric layer 162 may extend between the gate electrode 165 and the spacer structure 164, but the present disclosure is not limited thereto. The gate dielectric layer 162 may include an oxide, a nitride, or a high-k material. The high-k material may refer to a dielectric material having a higher dielectric constant than that of a silicon oxide layer ($SiO_2$). The high-k material may refer to a dielectric material having a higher dielectric constant than that of a silicon oxide layer ($SiO_2$). The high dielectric constant material may be, for example, at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In some embodiments, the gate dielectric layer 162 may be formed of multiple layers.

The gate electrode 165 may be disposed on the active regions 105 to fill a space between the plurality of channel layers 140 and to extend over the plurality of channel layers 140. The gate electrode 165 may be spaced apart from the plurality of channel layers 140 by the gate dielectric layer 162. The gate electrode 165 may include a conductive material, for example, a metal nitride such as titanium nitride (TiN), tantalum nitride (TaN), or tungsten nitride (WN), and/or a metal material such as aluminum (Al), tungsten. (W), molybdenum (Mo), or the like, or a semiconductor material such as doped polysilicon. In some embodiments, the gate electrode 165 may be formed of two or more multi-layers. Depending on a configuration of the semiconductor device 100, the gate electrode 165 may be disposed to be separated between at least some of adjacent transistors by a separate separator. The gate electrode 165 may include different materials according to transistor regions.

The spacer structure 164 may be disposed on both sidewalls of the gate electrode 165, and may extend in the Z-direction, perpendicular to the upper surface of the substrate 101. Each of the spacer structures 164 may include a portion in which a width of an upper portion thereof is narrower than a width of a lower portion thereof. A shape of the spacer structure 164 may be variously changed according to an embodiment. The spacer structure 164 may insulate the source/drain regions 150 and the gate electrode 165. The spacer structure 164 may be formed of multiple layers according to embodiments. The spacer structure 164 may be formed of an oxide, a nitride, or an oxynitride.

The capping layer 166 may be disposed on the gate electrode 165. The capping layer 166 may be a structure for protecting the gate electrode 165 from etching, in a subsequent process after forming the gate electrode 165. At least a portion of a lower surface of the capping layer 166 may be surrounded by the gate electrode 165 and the spacer structure 164. In an example embodiment, the capping layer 166 may include a convex lower surface toward the substrate 101, but a shape of the capping layer 166 may be variously changed according to embodiments. The capping layer 166 may include silicon nitride or a silicon nitride-based insulating material.

In an example embodiment, the gate structures 160 may include a first gate structure crossing the first active region 105*a* and the second active region 105*b*, a second gate structure crossing the third active region 105*c* and the fourth active region 105*d*, and a third gate structure crossing the fifth active region 105*e* and the sixth active region 105*f*. The first gate structure, the second gate structure, and the third gate structure may be separate gate structures, spaced apart from each other and extending in parallel, but according to an embodiment, may be a single gate structure extending continuously.

In an example embodiment, the semiconductor device 100 may further include internal spacer layers disposed between the plurality of channel layers 140 to be in parallel with the gate electrode 165. The gate electrode 165 or the gate dielectric layer 162 located below an uppermost channel layer, among the plurality of channel layers 140, may be electrically separated from the source/drain regions 150 by the internal spacer layers. The internal spacer layers may have a shape in which a side surface facing the gate electrode 165 is convexly rounded inward toward the gate electrode 165, but the present disclosure is not limited thereto. The internal spacer layers may be formed of an oxide, a nitride, or an oxynitride, and in particular, a low-k film. In some embodiments, the internal spacer layers may be omitted.

The contact plugs 170 may pass through the interlayer insulating layer 190 to be connected to the source/drain regions 150. The contact plugs 170 may apply an electrical signal to the source/drain regions 150. The contact plugs 170 may be disposed on the source/drain regions 150. In an example embodiment, each of the contact plugs 170 may have an inclined side surface of which width decreases in a direction toward the substrate 101 according to an aspect ratio, but the present disclosure is not limited thereto. The contact plugs 170 may be recessed from the source drain regions 150 by a predetermined depth, but the present disclosure is not limited thereto. In some embodiments, at least a portion of the contact plugs 170 may be disposed to contact along upper surfaces of the source/drain regions 150 without recessing the source/drain regions 150.

Each of the contact plugs 170 may include a plug layer and a barrier layer. The plug layer may include, for example, a metal nitride such as a TiN film, a TaN film, or a WN film, and/or a metal material such as Al, W, Mo, or the like. The barrier layer may conformally cover side and bottom surfaces of the plug layer. The barrier layer may include, for example, a metal nitride such as a TiN film, a TaN film, or a WN film.

The interlayer insulating layer 190 may be disposed to cover the source/drain regions 150 and the gate structures 160, and to cover the device isolation layers 107 in a region, not illustrated. The interlayer insulating layer 190 may include, for example, at least one of an oxide, a nitride, or an oxynitride, and may include a low-k material.

Figure 3:
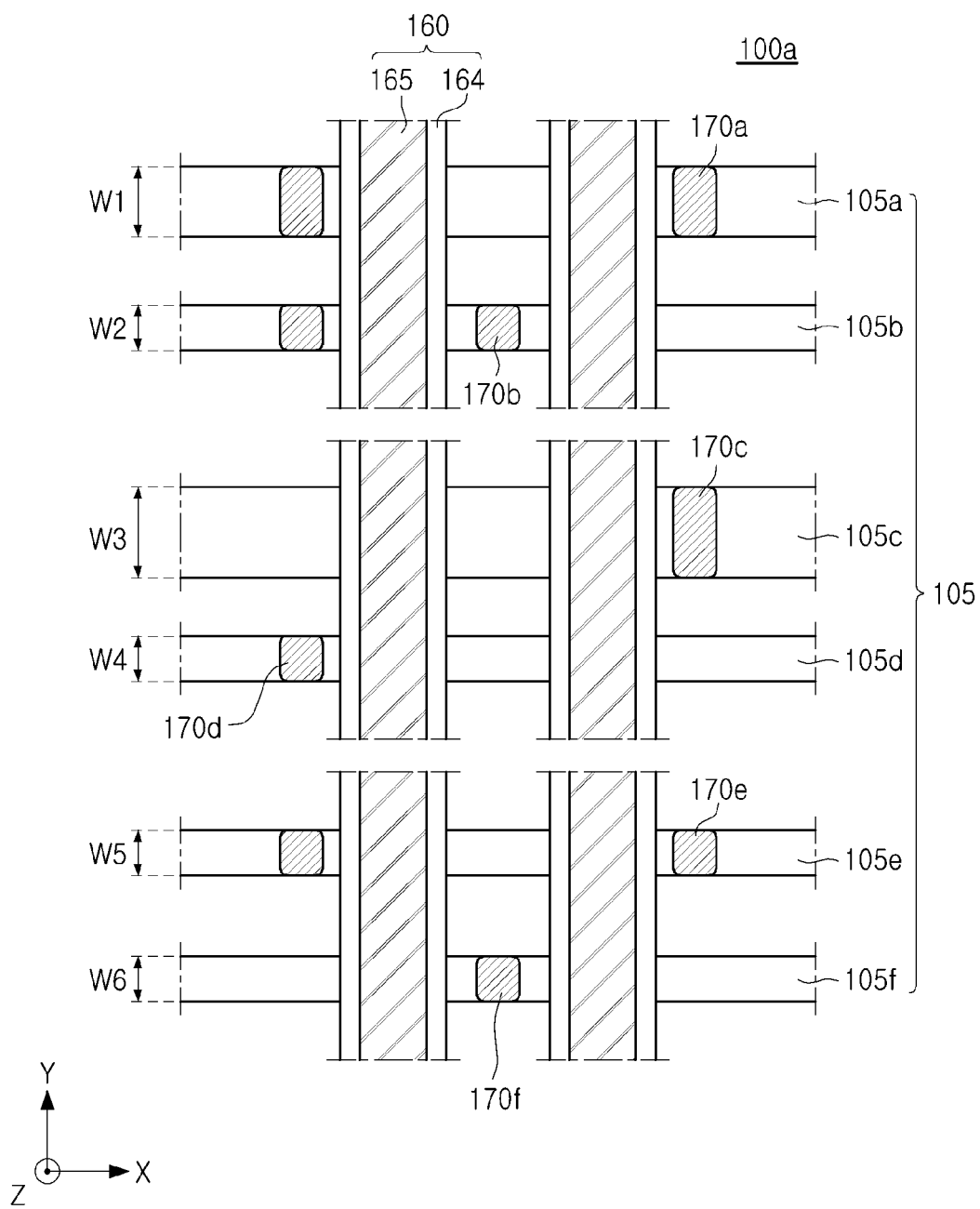
FIG. 3 is a plan view illustrating a semiconductor device according to an embodiment.

FIG. 3 is a plan view illustrating a semiconductor device 100a according to an embodiment.

Referring to FIG. 3, a semiconductor device 100a may include a plurality of contact plugs 170. The contact plugs 170 may include a first contact plug 170a on a first active region 105a and connected to a first source/drain region, a second contact plug 170b on a second active region 105b and connected to a second source/drain region, a third contact plug 170c on a third active region 105c and connected to a third source/drain region, a fourth contact plug 170d on a fourth active region 105d and connected to a fourth source/drain region, a fifth contact plug 170e on a fifth active region 105e and connected to a fifth source/drain region, and a sixth contact plug 170f on a sixth active region 105f and connected to a sixth source/drain region.

The first to sixth contact plugs 170a, 170b, 170c, 170d, 170e, and 170f may have, for example, different widths in the Y-direction. A width of the first contact plug 170a may be wider than a width of the second contact plug 170b. In an example embodiment, a difference between the width of the first contact plug 170a and the width of the second contact plug 170b may be substantially equal to a difference between a first width W1 and a second width W2. A width of the third contact plug 170c may be greater than a width of the fourth contact plug 170d. In an example embodiment, a difference between the width of the third contact plug 170c and the width of the fourth contact plug 170d may be substantially equal to a difference between a third width W3 and a fourth width W4. A width of the fifth contact plug 170e may be substantially equal to a width of the sixth contact plug 170f. In an example embodiment, a difference between the width of the fifth contact plug 170e and the width of the sixth contact plug 170f may be substantially equal to a difference between a fifth width W5 and a sixth width W6.

In the semiconductor device 100a according to an example embodiment, as compared with the semiconductor device 100 (e.g., FIG. 1) including contact plugs having a constant width regardless of widths of the active regions 105, a semiconductor device having improved performance may be provided by increasing widths of contact plugs 170 in proportion to widths of active regions 105. In an example embodiment, a width of each of the contact plugs 170 may be substantially equal to a width of each of the active regions 105, but the present disclosure is not limited thereto, and may be narrower than the width of each of the active regions 105 according to an example embodiment.

Figure 4A:
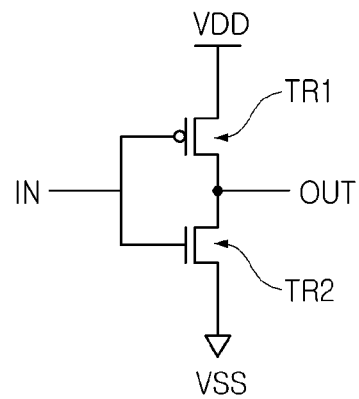
FIGS. 4A and 4B are cross-sectional views illustrating circuit diagrams and layouts for describing some elements of a semiconductor device according to an embodiment.
Figure 4B:
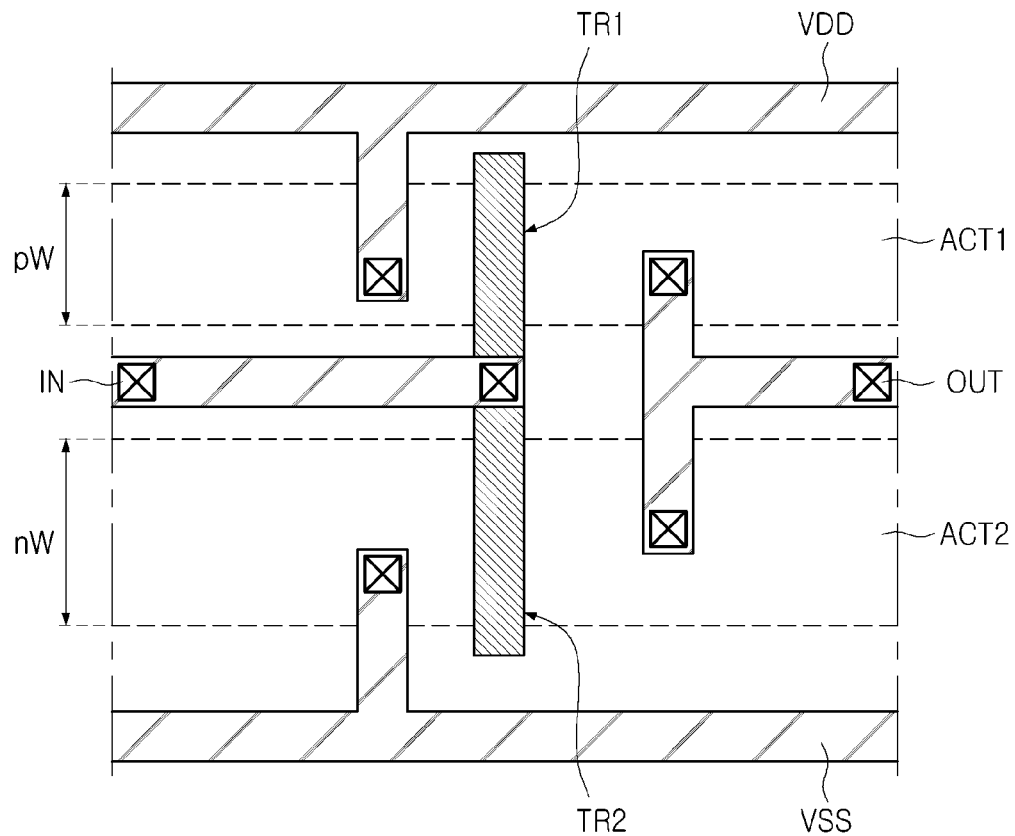
Figure 5A:
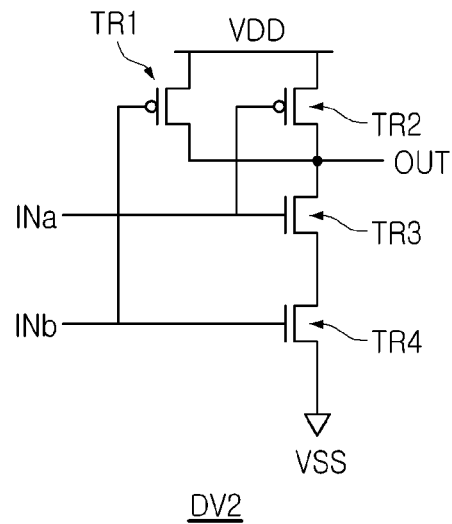
FIGS. 5A and 5B are cross-sectional views illustrating circuit diagrams and layouts for describing some elements of a semiconductor device according to an embodiment.
Figure 5B:
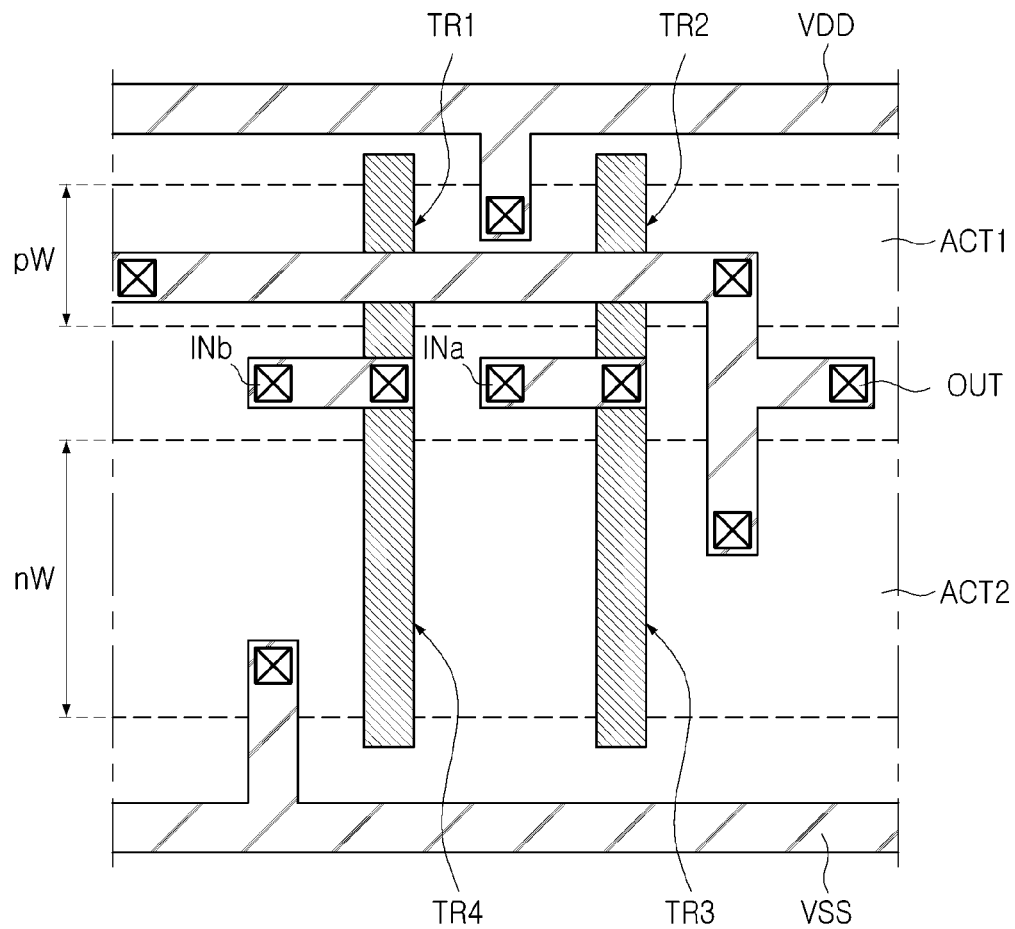
Figure 6A:
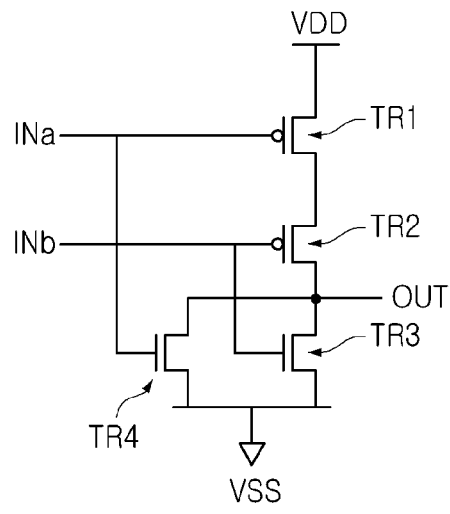
FIGS. 6A and 6B are cross-sectional views illustrating circuit diagrams and layouts for describing some elements of a semiconductor device according to an embodiment.
Figure 6B:
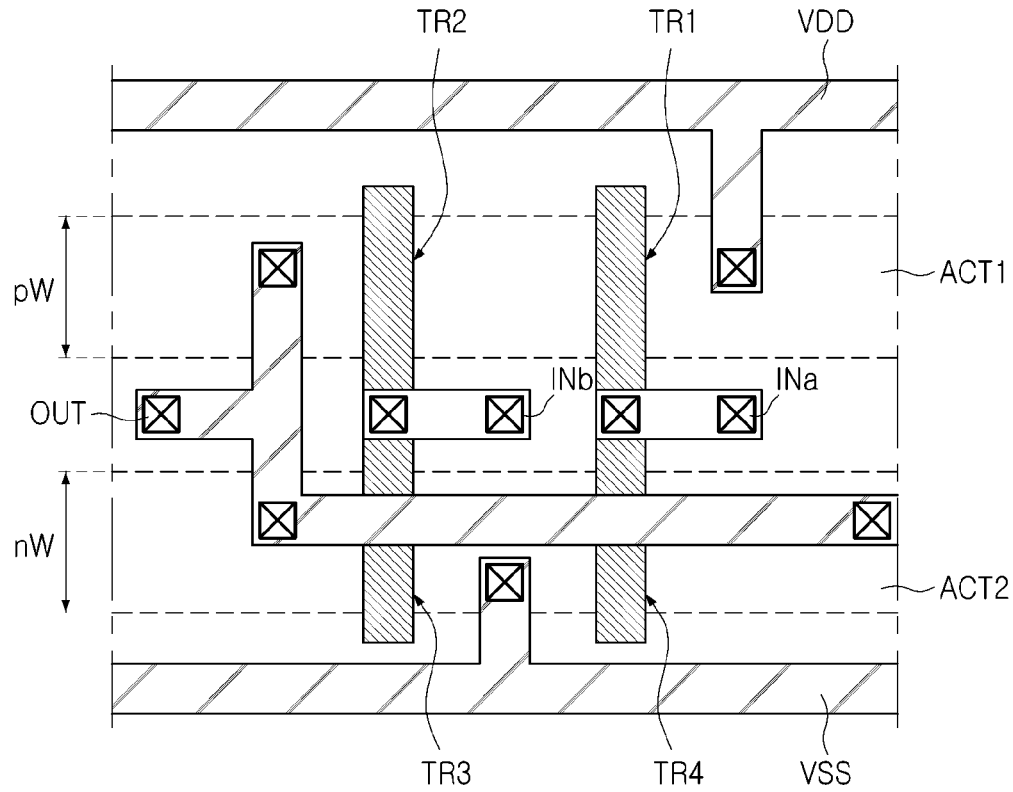

FIGS. 4A and 4B are cross-sectional views illustrating circuit diagrams and layouts for describing some elements of a semiconductor device 100 according to an embodiment. FIGS. 5A and 5B are cross-sectional views illustrating circuit diagrams and layouts for describing some elements of a semiconductor device 100 according to an embodiment. FIGS. 6A and 6B are cross-sectional views illustrating circuit diagrams and layouts for describing some elements of a semiconductor device 100 according to embodiment.

Referring to FIGS. 2B, 4A, and 4B, a first device DV1 may include a circuit in which the number of N-type transistors connected in series is equal to the number of P-type transistors connected in series. The first device DV1 may include, for example, an inverter circuit.

In an example embodiment, the inverter circuit may include a first transistor TR1 receiving a first power source VDD, and a second transistor TR2 connected to the first transistor TR1. The first transistor TR1 may be a P-type transistor, and the second transistor TR2 may be an N-type transistor.

Gates of the first and second transistors TR1 and TR2 may be connected to each other to provide an input terminal IN, and drain regions of the first and second transistors TR1 and TR2 may be connected to each other to provide an output terminal OUT. The first power source VDD may be applied to a first active region ACT1 of the first transistor TR1, and a second power source VSS may be applied to a second active region ACT2 of the second transistor TR2.

The first active region ACT1 of the first transistor TR1 may correspond to the second active region 105b in FIG. 1, and the second active region ACT2 of the second transistor TR2 may correspond to the first active region 105a in FIG. 1. A width pW of the first active region ACT1 of the first transistor TR1 may be narrower than a width nW of the second active region ACT2 of the second transistor TR2.

A time constant τ determining a response speed may be proportional to the product of resistance R and capacitance C, and as the time constant decreases, performance of a semiconductor device may be improved. When a width of an active region increases, the resistance R may decrease to increase driving current, but the capacitance C may increase. Also, driving current and capacitance of the N-type transistor and the P-type transistor may be different from each other, even when widths of active regions thereof are the same. In a CMOS device including an N-type transistor and a P-type transistor, when driving currents or capacitances of the transistors are the same or similar, performance of a semiconductor device may be improved. Therefore, performance of a semiconductor device may be improved by optimizing widths of active regions of both transistors in terms of driving current and capacitance.

In terms of driving current, since an N-type transistor uses an electron as a carrier and a P-type transistor uses a hole as a carrier, the N-type transistor may have driving current, larger than driving current of the P-type transistor having the same width. Therefore, the width of the active region of the P-type transistor may be relatively increased to control driving currents of both transistors to be the same or similar. In this case, capacitance C of the P-type transistor may also increase. In terms of capacitance, the P-type transistor may have capacitance, higher than capacitance of the N-type transistor. Therefore, the width of the active region of the N-type transistor may be relatively increased to control capacitance of both transistors to be the same or similar. According thereto, the driving current of the P-type transistor may be relatively reduced.

A semiconductor device according to an example embodiment of the present disclosure may provide a device in which a width of an active region of an N-type transistor is relatively increased in terms of capacitance, to control capacitance of both transistors to be the same or similar. In a semiconductor device having a high degree of integration, since an area of a crystal plane having high hole mobility, for example, a (110) plane corresponding to the side surfaces of the plurality of channel layers 140 of FIG. 2A may be relatively large, a decrease in driving current of a P-type transistor may be relatively small. Therefore, performance of the semiconductor device may be optimized by increasing the width of the active region of the N-type transistor.

In addition, in a semiconductor device according to an example embodiment of the present disclosure, a CMOS device without a dominant conductivity type, a CMOS device in which an N-type transistor is dominant, and a CMOS device in which a P-type transistor is dominant may be separately controlled widths of active regions to optimize performance of the semiconductor device. As described above, the dominant conductivity type may have a large resistance because the number of transistors connected in series may be large. Therefore, performance of the semiconductor device may be optimized by relatively increasing a width of an active region of the dominant conductivity type for each device.

In an example embodiment, the first device DV1 may not have a dominant conductivity type in terms of the P-type transistor and the N-type transistor. Therefore, performance of the semiconductor device may be improved by controlling the width pW of the active region ACT1 of the first transistor TR1 to be smaller than the width nW of the active region ACT2 of the second transistor TR2.

Referring to FIGS. 2C, 5A, and 5B, a second device DV2 may include a circuit in which the number of N-type transistors connected in series is greater than the number of P-type transistors connected in series. The second device DV2 may include, for example, a NAND circuit.

In an example embodiment, the NAND circuit may include first and second transistors TR1 and TR2 receiving a first power source VDD and connected in parallel to each other. The NAND circuit may include third and fourth transistors TR3 and TR4 connected in series with each other. The first and second transistors TR1 and TR2 may be P-type transistors, and the third and fourth transistors TR3 and TR4 may be N-type transistors.

Gates of the second and third transistors TR2 and TR3 may be connected to each other to provide a first input terminal INa, and gates of the first and fourth transistors TR1 and TR4 may be connected to each other to provide a second input terminal INb. Drain regions of the first, second, and third transistors TR1, TR2, and TR3 may be connected to each other to provide an output terminal OUT. The first power source VDD may be applied to a first active region ACT1 shared by the first and second transistors TR1 and TR2, and a second power source VSS may be applied to a second active region ACT2 shared by the third and fourth transistors TR3 and TR4. According to an embodiment, layout of the NAND circuit may be variously changed, unlike in FIG. 5B.

The first active region ACT1 may correspond to the fourth active region 105d in FIG. 1, and the second active region ACT2 may correspond to the third active region 105c in FIG. 1. A width pW of the first active region ACT1 may be narrower than a width nW of the second active region ACT2.

In an example embodiment, the second device DV2 may be an N-type dominant device, unlike the first device DV1. For example, in the NAND circuit, since there may be two N-type transistors connected in series, and there may be no P-type transistor connected in series, the N-type may be dominant. Therefore, the width nW of the second active region ACT2 of the second device DV2 may be wider than the width of the second active region of the first device DV1.

Referring to FIGS. 2D, 6A, and 6B, a third device DV3 may include a circuit in which the number of P-type transistors connected in series is greater than the number of N-type transistors connected in series. The third device DV3 may include, for example, a NOR circuit.

In an example embodiment, the NOR circuit may include first and second transistors TR1 and TR2 receiving a first power source VDD and connected in series with each other. The NOR circuit may include third and fourth transistors TR3 and TR4 connected in parallel to each other. The first and second transistors TR1 and TR2 may be P-type transistors, and the third and fourth transistors TR3 and TR4 may be N-type transistors.

Gates of the first and fourth transistors TR1 and TR4 may be connected to each other to provide a first input terminal INa, and gates of the second and third transistors TR2 and TR3 may be connected to each other to provide a second input terminal INb. Drain regions of the second, third, and fourth transistors TR2, TR3, and TR4 may be connected to each other to provide an output terminal OUT. The first power source VDD may be applied to a first active region ACT1 shared by the first and second transistors TR1 and TR2, and a second power source VSS may be applied to a second active region ACT2 shared by the third and fourth transistors TR3 and TR4. According to an embodiment, layout of the NOR circuit may be variously changed, unlike in FIG. 6B.

The first active region ACT1 may correspond to the sixth active region 105f in FIG. 1, and the second active region ACT2 may correspond to the fifth active region 105e in FIG. 1. A width pW of the first active region ACT1 may be substantially equal to a width nW of the second active region ACT2. In some embodiments, the width pW of the first active region ACT1 may be wider than the width nW of the second active region ACT2.

In an example embodiment, the third device DV3 may be a P-type dominant device, unlike the first device DV1. For example, in the NOR circuit, since there may be two P-type transistors connected in series, and there may be no N-type transistor connected in series, the P-type may be dominant. Therefore, the width nW of the second active region ACT2 of the third device DV3 may be narrower than the width of the second active region of the first device DV1.

Figure 7:
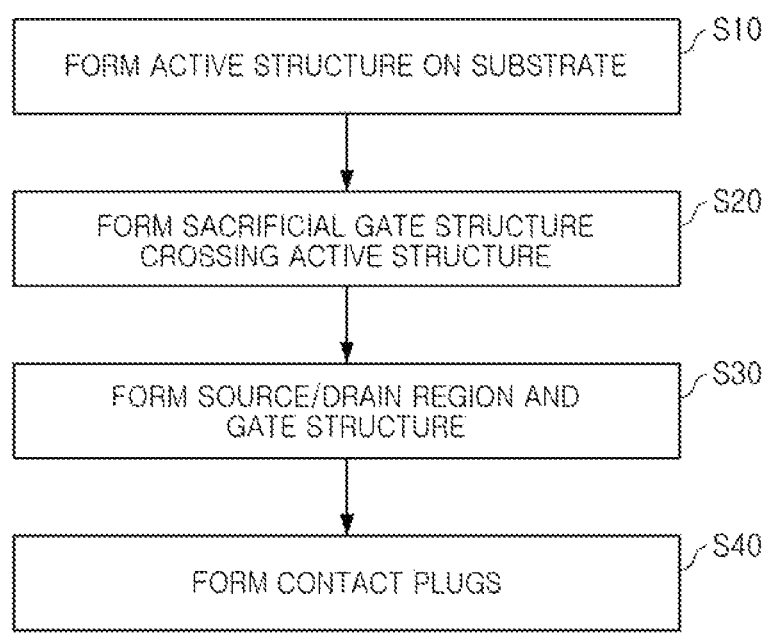
FIG. 7 is a flowchart illustrating a method of manufacturing a semiconductor device according to an embodiment.

FIG. 7 is a flowchart illustrating a method of manufacturing a semiconductor device according to an embodiment.

Referring to FIG. 7, first, in operation S10, active structures may be formed on a substrate. active structures may be prepared by alternately stacking sacrificial layers and a plurality of channel layers 140 (e.g., FIG. 2A) on a substrate 101 (e.g., FIG. 2A), and etching the sacrificial layers and the plurality of channel layers 140, alternately stacked, and at least a portion of the substrate 101, to form a trench defining active regions 105 (e.g., FIG. 2A). Therefore, the active structures may include the active regions 105, and the sacrificial layers and the plurality of channel layers 140, alternately stacked on the active regions 105.

The sacrificial layers and the plurality of channel layers 140 may be formed by an epitaxial growth process. The sacrificial layers may be replaced with a gate dielectric layer 162 (e.g., FIG. 2A) and a gate electrode 165 (e.g., FIG. 2A) by a subsequent process. The sacrificial layers and the plurality of channel layers 140 may include, for example, a semiconductor material including at least one of Si, SiGe, or Ge, but different materials may be included. In an example embodiment, the plurality of channel layers 140 may be stacked as three layers having substantially the same thickness, but the present disclosure is not limited thereto, and the number and thicknesses of the channel layers may be variously changed, according to embodiments.

The active regions 105 may be regions defined by the trench. The active regions 105 may be regions formed to protrude from an upper surface of the substrate 101 by removing a portion of the substrate 101. The active regions 105 may have a shape protruding from the substrate 101 in a direction, perpendicular to the Z-direction, and may be formed of the same material as the substrate 101. The active regions 105 may be formed in a linear shape extending in one direction, for example, the X-direction, and may be disposed to be spaced apart from each other in the Y-direction.

An insulating material may be buried in a region from which the portion of the substrate 101 is removed, and the insulating material may be then partially removed to protrude the active regions 105, to form device isolation layers 107 (e.g., FIG. 2A). The device isolation layers 107 may be formed to cover a portion of side surfaces of the active regions 105. Upper surfaces of the device isolation layers 107 may be formed to be lower than upper surfaces of the active regions 105. The device isolation layers 107 may include silicon oxide.

In an example embodiment, the active regions 105 may include first to sixth active regions 105a, 105b, 105c, 105d, 105e, and 105f (e.g., FIG. 1), spaced apart from each other in the Y-direction. The first active region 105a, the third active region 105c, and the fifth active region 105e may have P-type conductivity. The second active region 105b, the fourth active region 105d, and the sixth active region 105f may have N-type conductivity.

In this operation, a width of the trench may be adjusted to form a first active region 105a having a first width W1 (e.g., FIG. 1), a second active region 105b having a second width W2 (e.g., FIG. 1), a third active region 105c having a third width W3 (e.g., FIG. 1), a fourth active region 105d having a fourth width W4 (e.g., FIG. 1), a fifth active region 105e having a fifth width W5 (e.g., FIG. 1), and a sixth active region 105f having a sixth width W6 (e.g., FIG. 1). A device having various widths may be formed by controlling the width of each of the active regions 105, according to types of device to be formed by a subsequent process. Therefore, the first width W1 may be wider than the second width W2, the third width W3 may be wider than the fourth width W4, and the fifth width W5 may be substantially equal to the sixth width W6. Also, the active regions 105 may be formed such that a difference between the first width W1 and the second width W2 is smaller than a difference between the third width W3 and the fourth width W4.

Next, in operation S20, a sacrificial gate structure crossing the active structure may be formed.

Sacrificial gate structures may have a linear shape extending in one direction, for example, the Y-direction, respectively. The sacrificial gate structures may be sacrificial structures formed in a region in which the gate dielectric layer 162 and the gate electrode 165 are disposed on the plurality of channel layers 140 by a subsequent process, as shown in FIG. 2A. The sacrificial gate structures may include a sacrificial gate insulating layer, a sacrificial gate layer, and a sacrificial gate capping layer. The sacrificial gate insulating layer may include, for example, one of an oxide, silicon oxide, or silicon nitride, the sacrificial gate layer may include polysilicon, and the sacrificial gate capping layer may include a silicon nitride film. According to an embodiment, structures and shapes of the sacrificial gate structures may be variously changed.

Next, spacer structures 164 (e.g., FIG. 2A) may be formed on both sidewalls of the sacrificial gate structures. The spacer structure 164 may be in contact with a side surface of the sacrificial gate insulating layer. The spacer structure 164 may be prepared by forming a film having a uniform thickness along upper and side surfaces of the sacrificial gate structures and the active structures, and then performing anisotropic etching. The spacer structure 164 may include an insulating material, for example, at least one of silicon-oxide (SiO), silicon-nitride (SiN), silicon-carbon-nitride (SiCN), silicon-oxycarbide (SiOC), silicon-oxynitride (SiON), or silicon-oxycarbonitride (SiOCN).

Next, in operation S30, a source/drain region may be formed, and a gate structure may be formed.

Source/drain regions 150 (e.g., FIG. 2A) may be formed by the following process. The sacrificial layers and the plurality of channel layers 140 may be partially etched using the sacrificial gate structures as an etch mask, to form a recess, expose the active regions 105, and form source/drain regions 150 in the recess. In this operation, a portion of the sacrificial layers may be further removed from side surfaces of the sacrificial layers exposed by the recess. The sacrificial layers exposed by the recess may be selectively etched with respect to the plurality of channel layers 140 by, for example, a wet etching process to partially remove them from the side surfaces in the X-direction. Next, internal spacer layers may be formed in regions from which the side surfaces of the sacrificial layers are partially removed. The internal spacer layers may include at least one of SiN, SiCN, SiOCN, silicon-boron-carbonitride (SiBCN), or silicon-boron nitride (SiBN). In some embodiments, the removing a portion of the sacrificial layers and the forming the internal spacer layers may be omitted. Next, on at least one side of the sacrificial gate structures and the spacer structure 164, source/drain regions 150 may be formed on the active regions 105. The source/drain regions 150 may be formed by performing an epitaxial growth process in the recess.

Gate structures 160 (e.g., FIG. 2A) may be formed by the following process. The sacrificial gate capping layer may be removed by forming an interlayer insulating layer 190 (e.g., FIG. 2A) covering the sacrificial gate structures and the active regions 105 and performing a planarization process. Next, an upper gap region may be formed by removing the sacrificial gate layer and the sacrificial gate insulating layer, of which upper surfaces expose, and a lower gap region may be then formed by removing the sacrificial layers exposed from the upper gap region. For example, when the sacrificial layers include SiGe and the plurality of channel layers 140 include Si, the sacrificial layers may be selectively removed by performing a wet etching process using peracetic acid as an etchant. Next, a gate dielectric layer 162 and a gate electrode 165 may be sequentially formed in the upper gap region and the lower gap region. The gate dielectric layer 162 may be formed to conformally cover inner surfaces of the upper gap region and the lower gap region. The gate electrode 165 may be formed by completely filling the upper gap region and the lower gap region. Next, an upper surface of the gate electrode 165 and an upper surface of the spacer structure 164 may be partially etched by a predetermined depth to lower heights of the upper surfaces, and an insulating material may be buried in spaces formed as the upper surfaces are lowered, and a planarization process may be performed to form a capping layer 166. Therefore, the gate structures 160 including the gate dielectric layer 162, the gate electrode 165, the capping layer 166, and the spacer structure 164 may be formed.

Next, in operation S40, contact plugs 170 (e.g., FIG. 2A) connected to the source/drain regions 150 may be formed.

The interlayer insulating layer 190 may be anisotropically etched on the active regions 105 to form a contact hole exposing at least a portion of the source/drain regions 150. In an example embodiment, the contact hole may have a side surface inclined by decreasing a width in a direction toward the source/drain regions 150. In some embodiments, a linear contact trench, instead of a contact hole, may be formed. A contact plug 170 may be formed by filling the contact hole with a conductive material and performing a planarization process.

According to embodiments of the present disclosure, a semiconductor device having improved electrical performance, such as power characteristics and the like, may be provided by respectively adjusting a thickness of an active region of an N-type FET (NFET) and a thickness of an active region of a P-type FET (PFET) for each device.

According to some embodiments, in a device having a gate-all-around FET (GAAFET) structure and other structures, performance of a semiconductor device may be improved by varying channel widths of NFET and PFET regions for each inverter, a NAND device, and a NOR device. As a degree of integration increases, a driving current of the PFET may be sufficiently secured, and performance of the semiconductor device may be improved by relatively improving a channel width of the NFET region, instead of a channel width of the PFET region. As the degree of influence is changed depending on the width adjustment of the NFET region and the PFET region for each device, the channel widths may be separately adjusted. Thus, performance is improved by adjusting widths between one NFET region and one PFET region. Further, a width is controlled differently for each device, and a width of an NFET region is improved in terms of capacitance.

Various advantages and effects of the present disclosure are not limited to the above, and will be more easily understood in the process of describing specific embodiments of the present disclosure.

At least one of the components, elements, modules or units (collectively "components" in this paragraph) represented by a block in the drawings such as FIGS. 1, 2, 4, 6-9 may be embodied as various numbers of hardware, software and/or firmware structures that execute respective functions described above. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

While the disclosed embodiments has been particularly shown and described with reference to examples thereof, it will be understood that various changes in form and details may be made therein without departing from the spirit and scope of the following claims.

What is claimed is:

1. A semiconductor device, comprising:
a first device comprising:
   a first active region on a substrate and extending in a first direction parallel to an upper surface of the substrate,
   a plurality of first channel layers provided on the first active region and configured to be spaced apart from each other in a direction perpendicular to the upper surface of the substrate,
   a second active region spaced apart from and extending in parallel with the first active region,
   a plurality of second channel layers provided on the second active region and configured to be spaced apart from each other in the direction perpendicular to the upper surface of the substrate,
   at least one first gate structure crossing the first active region and the second active region and extending in a second direction,
   a first source/drain region provided on the first active region on at least one side of the at least one first gate structure, and
   a second source/drain region provided on the second active region on at least one side of the at least one first gate structure;
a second device comprising:
   a third active region on the substrate and extending in the first direction,
   a plurality of third channel layers provided on the third active region and configured to be spaced apart from each other in the direction perpendicular to the upper surface of the substrate,
   a fourth active region spaced apart from and extending in parallel with the third active region,
   a plurality of fourth channel layers provided on the fourth active region and configured to be spaced apart from each other in the direction perpendicular to the upper surface of the substrate,
   second gate structures crossing the third active region and the fourth active region and extending in parallel with each other in the second direction,
   a third source/drain region provided on the third active region on at least one side of the second gate structures, and
   a fourth source/drain region provided on the fourth active region on at least one side of the second gate structures; and
a third device comprising:
   a fifth active region on the substrate and extending in the first direction,
   a plurality of fifth channel layers provided on the fifth active region and configured to be spaced apart from each other in the direction perpendicular to the upper surface of the substrate,
   a sixth active region spaced apart from and extending in parallel with the fifth active region,
   a plurality of sixth channel layers provided on the sixth active region configured to be spaced apart from each other in the direction perpendicular to the upper surface of the substrate,
   third gate structures crossing the fifth active region and the sixth active region and extending in parallel with each other in the second direction,
   a fifth source/drain region provided on the fifth active region on at least one side of the third gate structures, and a sixth source/drain region provided on the sixth active region on at least one side of the third gate structures, wherein a first width of the first active region is wider than a second width of the second active region, wherein a third width of the third active region is wider than a fourth width of the fourth active region, and wherein a fifth width of the fifth active region is substantially equal to a sixth width of the sixth active region.

2. The semiconductor device of claim 1, wherein the first active region, the third active region, and the fifth active region comprise P-type conductivity, and wherein the second active region, the fourth active region, and the sixth active region comprise N-type conductivity.

3. The semiconductor device of claim 1, wherein a ratio of the first width and the second width is about 1.05:1 to about 1.15:1.

4. The semiconductor device of claim 1, wherein a ratio of the third width and the fourth width is about 1.1:1 to about 1.2:1.

5. The semiconductor device of claim 1, wherein a difference between the first width and the second width is less than a difference between the third width and the fourth width.

6. The semiconductor device of claim 1, wherein the first device further comprises an inverter circuit, wherein the second device further comprises a NAND circuit, and wherein the third device further comprises a NOR circuit.

7. The semiconductor device of claim 1, wherein the second device comprises N-type transistors connected in series, and wherein, in the second device, a number of N-type transistors connected in series is greater than a number of P-type transistors connected in series.

8. The semiconductor device of claim 1, wherein the third device comprises P-type transistors connected in series, and wherein, in the third device, a number of P-type transistors connected in series is greater than a number of N-type transistors connected in series.

9. The semiconductor device of claim 1, wherein a difference between a number of N-type transistors connected in series in the first device and a number of P-type transistors connected in series in the first device is less than a difference between a number of N-type transistors connected in series in the second device and a number of P-type transistors connected in series in the second device.

10. The semiconductor device of claim 1, wherein a difference between a number of P-type transistors connected in series in the first device and a number of N-type transistors connected in series in the first device is less than a difference between a number of P-type transistors connected in series in the third device and a number of N-type transistors connected in series in the third device.

11. The semiconductor device of claim 1, wherein the first active region, the second active region, the third active region, the fourth active region, the fifth active region and the sixth active region are spaced apart from each other, and wherein each of the first active region, the second active region, the third active region, the fourth active region, the fifth active region and the sixth active region has a constant width.

12. The semiconductor device of claim 1, further comprising contact plugs comprising:

a first contact plug provided on the first active region and connected to the first source/drain region, a second contact plug provided on the second active region and connected to the second source/drain region, a third contact plug provided on the third active region and connected to the third source/drain region, a fourth contact plug provided on the fourth active region and connected to the fourth source/drain region, a fifth contact plug provided on the fifth active region and connected to the fifth source/drain region, and a sixth contact plug provided on the sixth active region and connected to the sixth source/drain region, wherein, in the second direction, a width of the first contact plug is wider than a width of the second contact plug, a width of the third contact plug is wider than a width of the fourth contact plug, and a width of the fifth contact plug is substantially equal to a width of the sixth contact plug.

13. The semiconductor device of claim 12, wherein the first width of the first active region is substantially equal to the width of the first contact plug.

14. A semiconductor device comprising:

a substrate comprising a first device region and a second device region;

active regions spaced apart from each other on the substrate, having a constant width, extending in a first direction parallel to an upper surface of the substrate, and comprising:

a first active region and a second active region provided on the first device region, and a third active region and a fourth active region provided on the second device region;

a plurality of channel layers provided on the active regions and configured to be spaced apart from each other in a direction perpendicular to the upper surface of the substrate;

gate structures provided on the substrate and extending to cross the active regions and the plurality of channel layers; and source/drain regions provided on the active regions on at least one side of the gate structures, wherein the first active region and the third active region comprise P-type conductivity, wherein the second active region and the fourth active region comprise N-type conductivity, wherein a first width of the first active region is wider than a second width of the second active region;

wherein a third width of the third active region is wider than a fourth width of the fourth active region; and wherein a difference between the first width and the second width is less than a difference between the third width and the fourth width.

15. The semiconductor device of claim 14, wherein the active regions further comprise a fifth active region and a sixth active region, and wherein a fifth width of the fifth active region is substantially equal to a sixth width of the sixth active region.

16. The semiconductor device of claim 15, further comprising:

an inverter circuit comprising the first active region and the second active region;

a NAND circuit comprising the third active region and the fourth active region; and a NOR circuit comprising the fifth active region and the sixth active region.

17. The semiconductor device of claim 14, further comprising contact plugs on the active regions and configured to be connected to the source/drain regions, wherein a width of each of the contact plugs is substantially equal to a width of each of the active regions.

18. A semiconductor device comprising:
a first device comprising:
   a first active region on a substrate and extending in a first direction parallel to an upper surface of the substrate,
   a second active region spaced apart from and extending in parallel with the first active region,
   at least one first gate structure crossing the first active region and the second active region and extending in a second direction,
   a first source/drain region provided on the first active region on at least one side of the at least one first gate structure, and
   a second source/drain region provided on the second active region on at least one side of the at least one first gate structure; and
a second device comprising:
   a third active region on the substrate and extending in the first direction,
   a fourth active region spaced apart from and extending in parallel with the third active region,
   second gate structures crossing the third active region and the fourth active region and extending in parallel with each other in the second direction,
   a third source/drain region provided on the third active region on at least one side of the second gate structures, and
   a fourth source/drain region provided on the fourth active region on at least one side of the second gate structures,
wherein the first active region and the third active region comprise P-type conductivity,
wherein the second active region and the fourth active region comprise N-type conductivity,
wherein a first width of the first active region is wider than a second width of the second active region,
wherein a third width of the third active region is wider than a fourth width of the fourth active region, and
wherein a difference between the first width and the second width is less than a difference between the third width and the fourth width.

19. The semiconductor device of claim 18, wherein a number of N-type transistors connected in series in the first device is less than a number of N-type transistors connected in series in the second device.

20. The semiconductor device of claim 18, further comprising:
   a third device comprising a fifth active region on the substrate, extending in the first direction, and comprising P-type conductivity,
   a sixth active region spaced apart from and extending in parallel with the fifth active region, and comprising N-type conductivity,
   third gate structures crossing the fifth active region and the sixth active region and extending in parallel with each other in the second direction,
   a fifth source/drain region provided on the fifth active region on at least one side of the third gate structures, and
   a sixth source/drain region provided on the sixth active region on at least one side of the third gate structures,
wherein a number of P-type transistors connected in series in the first device is less than a number of P-type transistors connected in series in the third device, and
wherein a difference between the first width and the second width is greater than a difference between a fifth width of the fifth active region and a sixth width of the sixth active region.

* * * * *